United States Patent
Logan (10) Patent No.: US 7,728,677 B2
(45) Date of Patent: Jun. 1, 2010

(54) METHOD AND APPARATUS FOR CALIBRATING A VOLTAGE CONTROLLED OSCILLATOR BY VARYING VOLTAGE APPLIED TO POWER SUPPLY INPUT

(75) Inventor: Shawn M. Logan, Andover, MA (US)

(73) Assignee: Agere Systems Inc., Allentown, PA (US)

( * ) Notice: Subject to any disclaimer, the term of this patent is extended or adjusted under 35 U.S.C. 154(b) by 42 days.

(21) Appl. No.: 11/840,361

(22) Filed: Aug. 17, 2007

(65) Prior Publication Data
US 2009/0045881 A1 Feb. 19, 2009

(51) Int. Cl.
*H03L 7/00* (2006.01)
(52) U.S. Cl. .............................. 331/17; 331/16; 331/18; 331/57; 331/185
(58) Field of Classification Search .................... 331/16, 331/17, 18, 57, 185; 327/149, 158, 161
See application file for complete search history.

(56) References Cited
U.S. PATENT DOCUMENTS

| | | | | |
|---|---|---|---|---|
| 5,959,502 A | * | 9/1999 | Ovens et al. ................... 331/8 |
| 6,928,128 B1 | * | 8/2005 | Sidiropoulos ................ 375/376 |
| 6,940,359 B2 | * | 9/2005 | Ishii ............................. 331/185 |
| 7,126,433 B2 | * | 10/2006 | Godambe et al. .............. 331/74 |
| 2003/0179842 A1 | * | 9/2003 | Kane et al. .................... 375/376 |
| 2003/0210099 A1 | * | 11/2003 | Ingino, Jr. ...................... 331/57 |
| 2004/0008063 A1 | * | 1/2004 | Kim et al. ..................... 327/158 |
| 2007/0030079 A1 | * | 2/2007 | Kawamoto et al. ............ 331/16 |

* cited by examiner

*Primary Examiner*—Joseph Chang
*Assistant Examiner*—Jeffrey Shin
(74) *Attorney, Agent, or Firm*—Ryan, Mason & Lewis, LLP

(57) ABSTRACT

Methods and apparatus are provided for calibrating a voltage controlled oscillator, such as an N-stage voltage controlled ring oscillator. The voltage controlled oscillator comprises a power supply input and at least one gate delay element and has a frequency that is a function of a delay of the gate delay element and a voltage applied to the power supply input. A voltage controlled oscillator is calibrated by varying an output voltage of a programmable voltage source through a range of values; applying the output voltage to the power supply input of the voltage controlled oscillator; comparing an output clock frequency of the voltage controlled oscillator to a reference frequency clock for each of the output voltage values; and selecting a value of the output voltage that provides an approximate minimum frequency difference between the output clock frequency and the reference frequency clock.

20 Claims, 7 Drawing Sheets

METHOD AND APPARATUS FOR CALIBRATING A VOLTAGE CONTROLLED OSCILLATOR BY VARYING VOLTAGE APPLIED TO POWER SUPPLY INPUT

FIELD OF THE INVENTION

The present invention relates generally to calibration techniques for a voltage controlled oscillator, and more particularly, to calibration techniques for voltage controlled oscillators that are based on varying the voltage applied to the power supply input of the voltage controlled oscillator.

BACKGROUND OF THE INVENTION

The anticipated variation in silicon processing and the range of environmental conditions must be considered when designing an integrated circuit to guarantee that the circuit meets the appropriate performance requirements. The variation in silicon processing and environmental conditions can cause significant circuit performance changes. As a result, compromises must often be made when designing a circuit to guarantee that the circuit is robust even in the presence of all silicon process and environmental effects. For example, the size of a CMOS buffer must be chosen larger than the size required for typical device performance in older to meet performance requirements under a silicon process and environment that produces "slow" devices When a circuit is designed to meet all requirements in the presence of the full amount of silicon process and environmental conditions, the overall circuit performance is generally compromised. Specifically, a circuit designed under a set of "typical" process conditions must be sized greater than necessary under "typical" processing conditions to meet performance requirements under a set of "slow" process conditions. Supply currents under a "fast" silicon process case are much greater than required and, as a result, signal and power supply trace widths must be increased significantly to reduce the reliability risk of electromigration.

A number of techniques have been proposed or suggested for compensating for process variation and leakage current. For example, the impact of process variation is often reduced by designing a circuit such that the circuit is capable of meeting performance requirements over the entire range of silicon process and environmental conditions. Other techniques employ statistical device models that gauge the probability of a circuit parameter reaching an undesired level. With such statistical models, the "effective" silicon process variation is reduced to a low probability level. The "corner" cases, however are not eliminated More recently, circuit techniques such as transistor-stacking, the use of multiple threshold devices, applying a body bias to devices subject to high leakage currents or forcing unused circuits in a device to a low leakage state have been employed to minimize device leakage current. Such techniques, however, either require new circuit design topologies not available in many common libraries, add silicon processing steps to allow for multiple CMOS device thresholds or require control techniques to adjust the body voltage of devices. Thus, the design time, circuit area, and cost may all be increased.

A need therefore exists for methods and apparatus for compensating for the impact of silicon process variation. A further need exists for methods and apparatus that compensate for silicon process variation while also reducing device leakage current and maximum device power dissipation

SUMMARY OF THE INVENTION

Generally, methods and apparatus are provided for calibrating a voltage controlled oscillator, such as an N-stage voltage controlled ring oscillator. The voltage controlled oscillator comprises a power supply input and at least one gate delay element and has a frequency that is a function of a delay of the gate delay element and a voltage applied to the power supply input. According to one aspect of the invention, a voltage controlled oscillator is calibrated by varying an output voltage of a programmable voltage source through a range of values; applying the output voltage to the power supply input of the voltage controlled oscillator; comparing an output clock frequency of the voltage controlled oscillator to a reference frequency clock for each of the output voltage values; and selecting a value of the output voltage that provides an approximate minimum frequency difference between the output clock frequency and the reference frequency clock. A control voltage of the voltage controlled oscillator can be set such that the voltage controlled oscillator operates at a constant frequency.

According to further aspects of the invention, the selected output voltage value is optionally provided to other on-chip power sources or to an external voltage source for an Application Specific Integrated Circuit (ASIC). The present invention may thus be used for a single section of an ASIC, an entire ASIC or supplied to an ASIC customer for use with an external power source.

Generally, the selected output voltage value provides an overall average indicator of a silicon process. For example, a lower value of the selected output voltage relative to a nominal voltage value is selected for a "fast" silicon process and a higher value of the selected output voltage relative to a nominal voltage value is selected for a "slow" silicon process.

A more complete understanding of the present invention, as well as further features and advantages of the present invention, will be obtained by reference to the following detailed description and drawings.

DETAILED DESCRIPTION

The present invention provides methods and apparatus for compensating for silicon process variation and reducing device leakage current. Voltage controlled oscillators (VCOs) typically comprise a power supply input and at least one gate delay element. The VCO will typically have a frequency that is a function of a delay of the gate delay element and the voltage applied to the power supply input. According to one aspect of the present invention, a value is determined during a calibration phase for the voltage applied to the power supply input that reduces the impact of silicon process variation on circuit performance. The voltage applied to the power supply input or the value of such voltage is optionally provided to other on-chip regulators or to an external voltage regulator for an Application Specific Integrated Circuit (ASIC). The present invention may thus be used for a single section of an ASIC, an entire ASIC or supplied to an ASIC customer for use with an external power source.

Integrated Circuit Design and Performance

Figure 1:
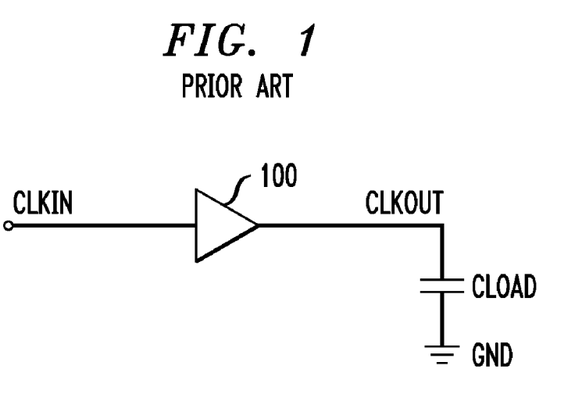
FIG. 1 illustrates a conventional CMOS buffer that drives a load capacitance CLOAD with input and output signals, CLKIN and CLKOUT, respectively.
Figure 2:
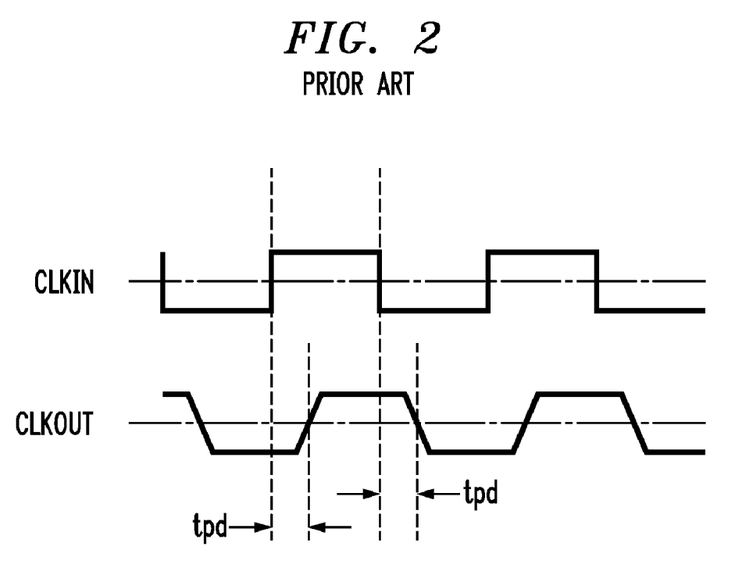
FIG. 2 defines the average propagation delay time, tpd, of the buffer of FIG. 1.

As indicated above, when designing an integrated circuit, both the anticipated variation in silicon processing and the range of environmental conditions must be considered to guarantee that a circuit meets the appropriate performance requirements. To illustrate the impact of both silicon process variation and circuit environment, their impact will be examined on the propagation delay of an exemplary CMOS buffer. The propagation delay of a buffer often sets its maximum frequency of use or, alternately, the number of parallel instances of the buffer required to meet a specific application FIG. 1 illustrates a CMOS buffer 100 that chives a load capacitance CLOAD with input and output signals, CLKIN and CLKOUT, respectively. FIG. 2 provides a graphical view of the input and output signals of the buffer 100 of FIG. 1, as a function of time. FIG. 2 defines the average propagation delay time, tpd, of the buffer 100. As shown in FIG. 2, the output signal, CLKOUT, changes tpd after the input signal, CLKIN, due to the propagation delay of the buffer 100.

The magnitude of the propagation delay time of a CMOS buffer is dependent on many factors. If the load capacitance of the buffer is unchanged, the major sources of its variation are related to silicon processing parameters, changes in buffer supply voltage and the internal host ASIC temperature. The impact of each of these three sources of variation on the average propagation delay and power dissipation is considered in the following sections.

Silicon Process Variation and ASIC Temperature Effects on Propagation Delay

In the most common case, the variation of silicon processing is encapsulated in a set of device models representing silicon processes that produce "slow" devices, "typical" devices, and "fast" devices "Slow" and "fast" silicon process conditions produce devices whose maximum frequency of operation are at the minimum and maximum expected levels of the process, respectively "Typical" silicon process parameters produce devices whose performance is close to the expected mean of all devices manufactured.

Figure 3:
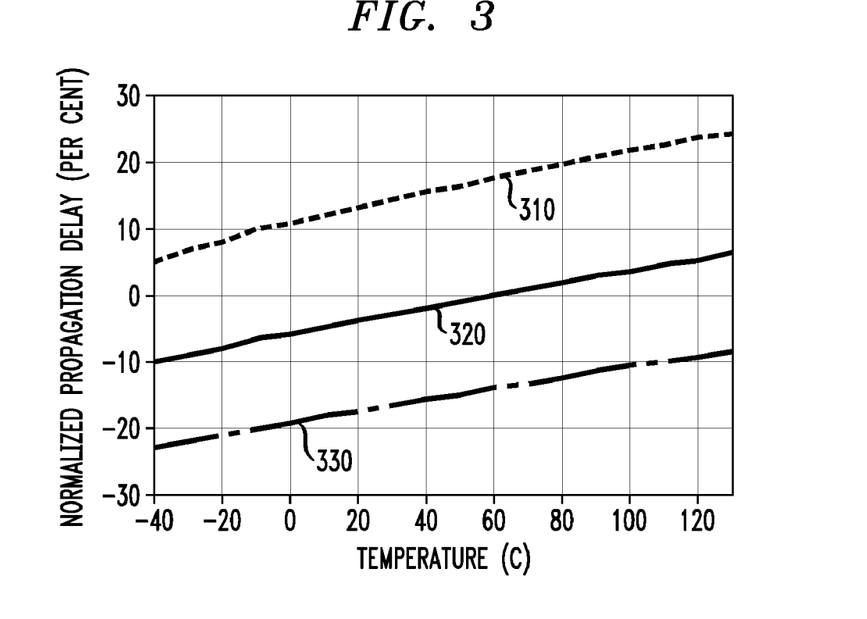
FIG. 3 illustrates the variation in average buffer propagation delay for "slow," "typical," and "fast" process cases, normalized to its average propagation delay in a typical process.

Consider the variation in device performance with silicon process under "slow", "typical", and "fast" process cases. FIG. 3 illustrates the variation in average buffer propagation delay for "slow" 310, "typical" 320, and "fast" 330 process cases, normalized to the value under "typical" silicon process conditions at an ASIC temperature of 60 C. For example, at an ASIC temperature of 60 C, a "fast" silicon process 330 decreases the typical propagation delay by 14%, and a "slow" silicon process 310 increases the average propagation delay time by 18%

If the impact of ASIC temperature is considered on propagation delay, in the "slow" process case 310, the variation in propagation delay from −40 C to +120 C from a temperature of 60 C is about −13% to +6%. If the combined effect of silicon process and temperature are considered, the total variation in propagation delay from its "typical" process value 320 at 60 C is between −23% and +24% or about ±25%.

Silicon Process Variation and Supply Voltage Effects on Propagation Delay

Figure 4:
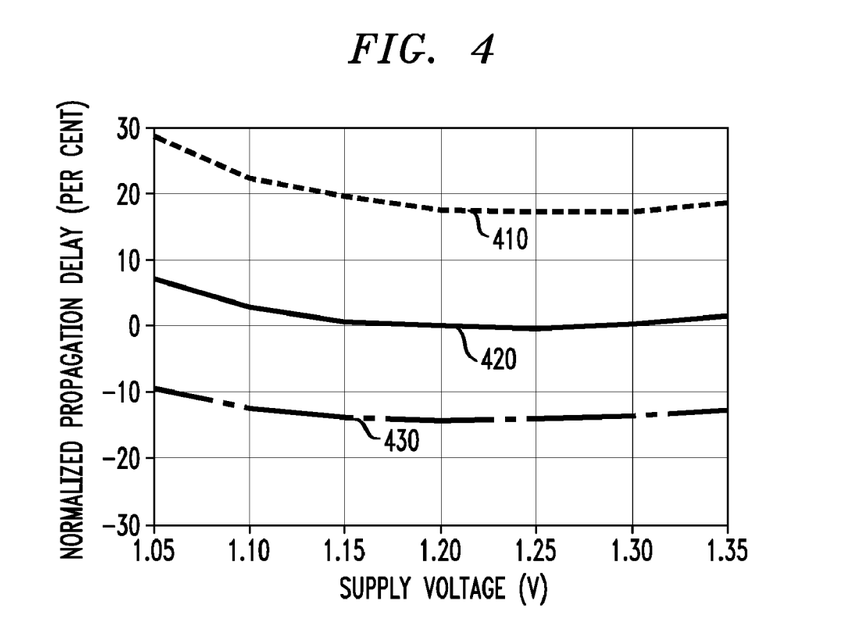
FIG. 4 illustrates the variation in average buffer propagation delay as a result of a ±10% variation supply voltage for devices representative of "slow," "typical," and "fast" process cases also normalized to its average propagation delay time at a nominal 1.20 V supply voltage in a typical silicon process.

The propagation delay of a CMOS buffer is also dependent on its supply voltage FIG. 4 illustrates the variation in average buffer propagation delay as a result of a ±10% variation in supply voltage for devices representative of "slow" 410, "typical" 420, and "fast" 430 process cases. The propagation delays are normalized to the delay of a "typical" buffer at the nominal supply voltage of 1.20 V and a temperature of 65 C. In the slow process case 410, the variation in propagation delay as a result of a −10% supply voltage change is about +11%. As shown in FIG. 4, very little change in average propagation delay time is observed with a +10% increase in supply voltage from 1.20 V.

If the variations due to silicon processing, temperature and supply voltage awe considered on buffer propagation delay, the delay can vary from as low as −30% to as high as +35% of its typical value. Not included in this estimate is the fact that the value of load capacitance (CLOAD in FIG. 1) will also vary with silicon process.

To accommodate this large variation, an integrated circuit must be designed to have robust performance over this range of delay times. An undesirable side effect of this process is that a buffer that must achieve a minimum propagation delay time of t1 must be designed under a "typical" silicon process to have a propagation delay time of about 75% of t1 such that its minimum propagation delay time is t1 when the maximum positive variation of 35% is considered. Hence, the resulting area and power dissipation of the buffer 100 are increased in the "typical" process case to allow for the variation found in a "slow" silicon process 310, 410

Process Variations Temperature and Supply Voltage Effects on Power Dissipation

Figure 5:
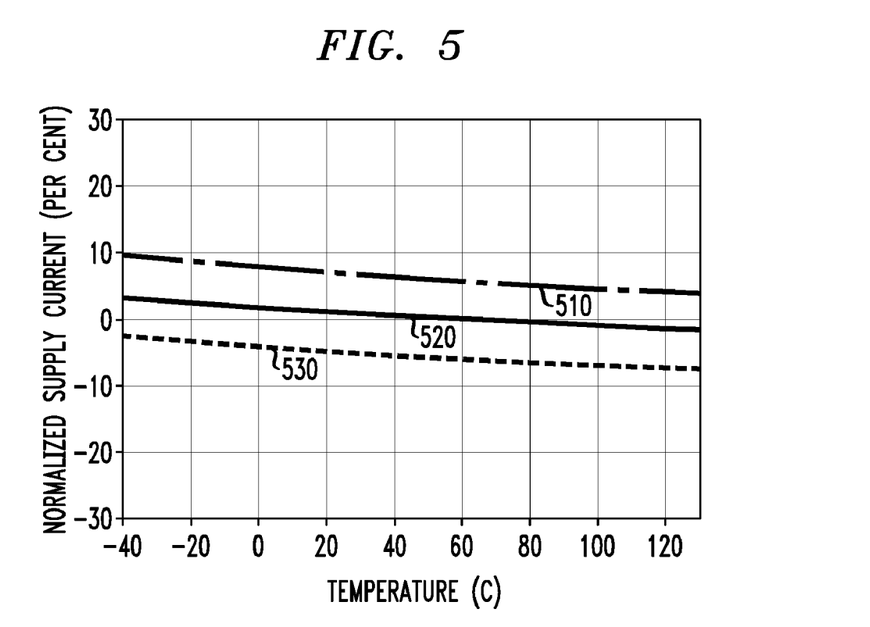
FIGS. 5 and 6 illustrate the normalized variation in supply current for the CMOS buffer of FIG. 1, as a function of temperature and supply voltage, respectively.
Figure 6:
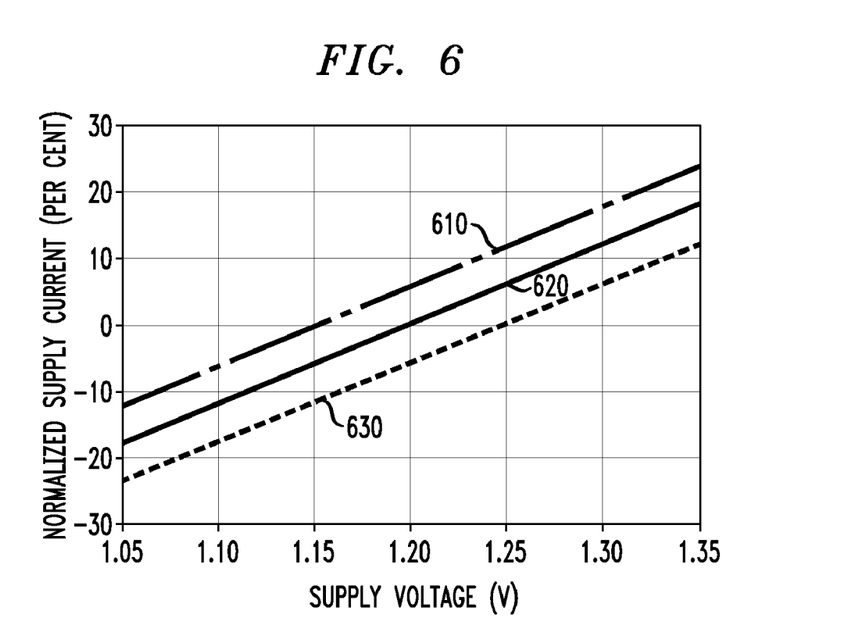

In addition to the variation in buffer propagation delay time with silicon process, temperature, and supply voltage, the supply current is also found to vary significantly FIGS. 5 and 6 illustrate the variation in supply current for the CMOS buffer 100 of FIG. 1, as a function of temperature and supply voltage, respectively. Over silicon process and temperature, it is seen to vary from −8% to +10% of its typical value.

When considering the impact of supply voltage (FIG. 6), the supply current varies about ±18% from its typical value at a supply voltage of 1.20 V. The combined effect of silicon process, temperature and supply voltage suggest the total supply current variation is about ±28%. To allow for the variation in supply current and still achieve circuit performance requirements, a package with sufficient thermal characteristics must be selected to allow for a power dissipation of at least 28% in excess of the power dissipation under typical process and environmental conditions.

Reducing Impact of Silicon Process and Minimizing Design Effort

Figure 7:
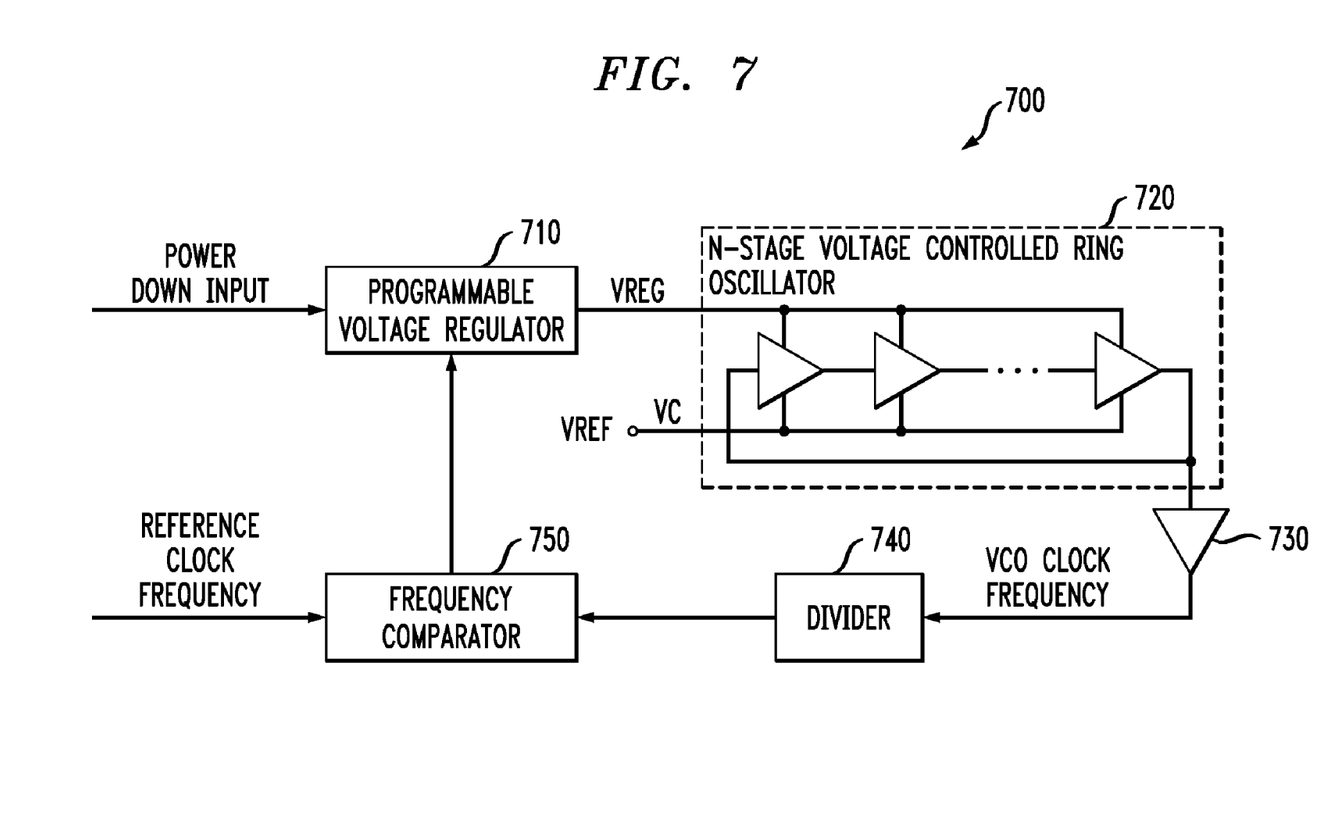
FIG. 7 is a schematic block diagram of a circuit incorporating features of the present invention.

FIG. 7 is a schematic block diagram of a circuit 700 incorporating features of the present invention. According to various aspects of the present invention, the impact of silicon process variation is reduced by using a frequency calibration algorithm in combination with a VCO 720 and programmable voltage regulator 710. As used herein, a programmable voltage regulator 710 includes any power source whose output voltage may be set to one of a number of values. The impact of this process not only reduces the variation in circuit performance, but also minimizes power dissipation, reduces design time and provides for more optimal circuit performance.

Calibration Process

As shown in FIG. 7, the control voltage of the ring oscillator, VC, is set to a DC reference voltage, shown as VREF. This sets the output frequency of the VCO 720 to a constant frequency. In the exemplary embodiment of FIG. 7, the VCO 720 is embodied as an N-stage voltage controlled ring oscillator. With the programmable voltage regulator 710 set to its maximum output voltage VREGmax, a frequency comparator 750 compares a divided version of the VCO output clock frequency to the externally applied reference frequency clock. The relative frequency difference between the externally applied reference clock frequency and the divided VCO clock frequency is recorded. The optional frequency divider 740 is employed after a buffer 730 if the VCO 720 is operating at a higher frequency than the frequency of the reference clock that is used for comparison. The optional frequency divider 740 lowers the frequency of the VCO output to a value near the reference clock. For example, the VCO frequency may operate at a rate that is 16-20 times the rate of the reference clock. Thus, the frequency divider 740 must divide the VCO frequency by a factor of 16-20.

The voltage regulator 710 is then programmed to its next lowest value and a second frequency difference between the reference clock and divided VCO clock is recorded. This process is repeated until the programmable voltage regulator 710 is set to its lowest output voltage. As an example, a total of eight (8) programmable voltage regulator output settings (3 bits of control) might range from 1.34 V to 1.08 V.

Following this process, the output voltage of the regulator 710 is programmed by the frequency comparator 750 to the value that provided the minimum frequency difference between the external reference clock and the VCO divided clock. The selected voltage regulator setting provides an overall average indicator of the silicon process. Since there is a con elation among the gate delays of other devices fabricated with the same silicon process, the selected voltage regulator setting can be made available to the host ASIC for use in other circuits powered off a different programmable regulator. The VCO 720 and its regulator 710 are powered down after this process is complete unless they are used in the ASIC for other purposes.

Figure 8:
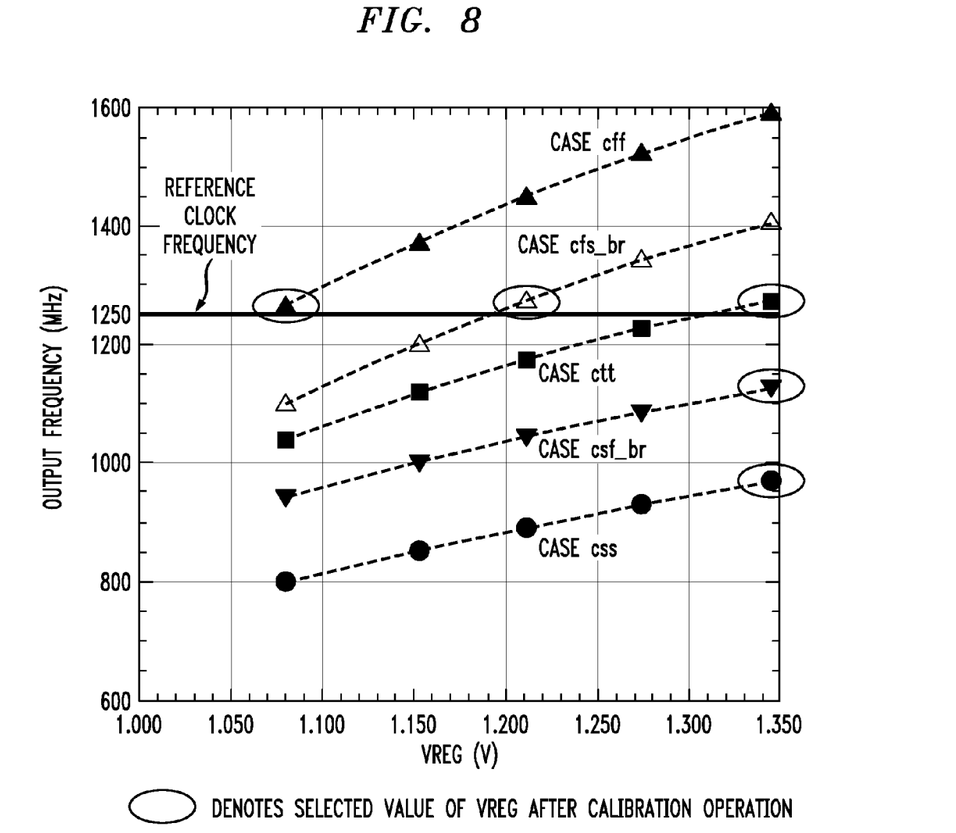
FIG. 8 illustrates the undivided frequency of the VCO output as a function of the applied voltage from the regulator of FIG. 7 fox various process cases.

FIG. 8 illustrates the undivided frequency of the VCO output as a function of the applied voltage from the regulator 710 of FIG. 7 for various process cases. For example, under silicon process case "cff" (a fast silicon process), the voltage regulator is set to its minimum value of 1.08 V, whereas in silicon process case "css" (a slow silicon process), the voltage regulator is set to its maximum value of 1.34 V. FIG. 8 also displays the selected value of VREG for three other silicon process cases: ctt, a typical silicon process; cfs_br, a fast n-channel, slow p-channel, and low silicon resistor process case; and csf_, a slow n-channel, fast p-channel, and low silicon resistor process case.

Impact of Calibration Process on Buffer Propagation Delay

With reference to the variations of buffer propagation delay shown in FIG. 4, when using the disclosed calibration process, the supply voltage is set to 1.08 V in the fast process and to 1.34 V in the slow and typical process cases, as shown in FIG. 8 As a result, the maximum increase in propagation delay from its typical value is about 17% and the maximum decrease is found to be −11% Without the calibration process, the propagation delay varies between +28% and −15% of its typical value. In total, including the effect of temperature, the range of propagation delay with the calibration process is reduced from −30%, +35% (65%) to a range of −22%, +24% (46%).

Impact of Calibration Process on Buffer Supply Current

With reference to FIGS. 5 and 6, and the corresponding discussion, the combined effect of silicon process, temperature and supply voltage results in a total supply current variation of about ±28% of its typical value. If the calibration process is used to set the supply voltage, the maximum supply current occurs under a typical silicon process. Under fast silicon process conditions, the supply current is about −20% of its typical value. When combined with the ±2.5% change in supply current with temperature, the supply current range is reduced from ±28% to +2.5% and −22.5%.

Impact of Calibration Process on Device Leakage Current

In nanometer CMOS silicon technologies, additional MOS gate current in the form of leakage current represents a significant percentage of device power dissipation (See, for example, W. Elgharbawy and M. Bayoumi, "Leakage Sources and Possible Solutions in Nanometer CMOS Technologies," IEEE Circuits and Systems, fourth quarter, 2005). A dominant source of the gate current is due to quantum tunneling through the relatively thin gate oxides. The magnitude of tunneling leakage current is sensitive to the voltage across the gate, which is typically the supply voltage or ground in CMOS technology, and exponentially related to gate oxide thickness. Under a "fast" silicon process, the magnitude of gate leakage current is significantly greater than under a "typical" or "slow" silicon process since a "fast" silicon process case produces n-channel and p-channel devices whose oxide thickness are less than the typical oxide thickness.

Figure 9:
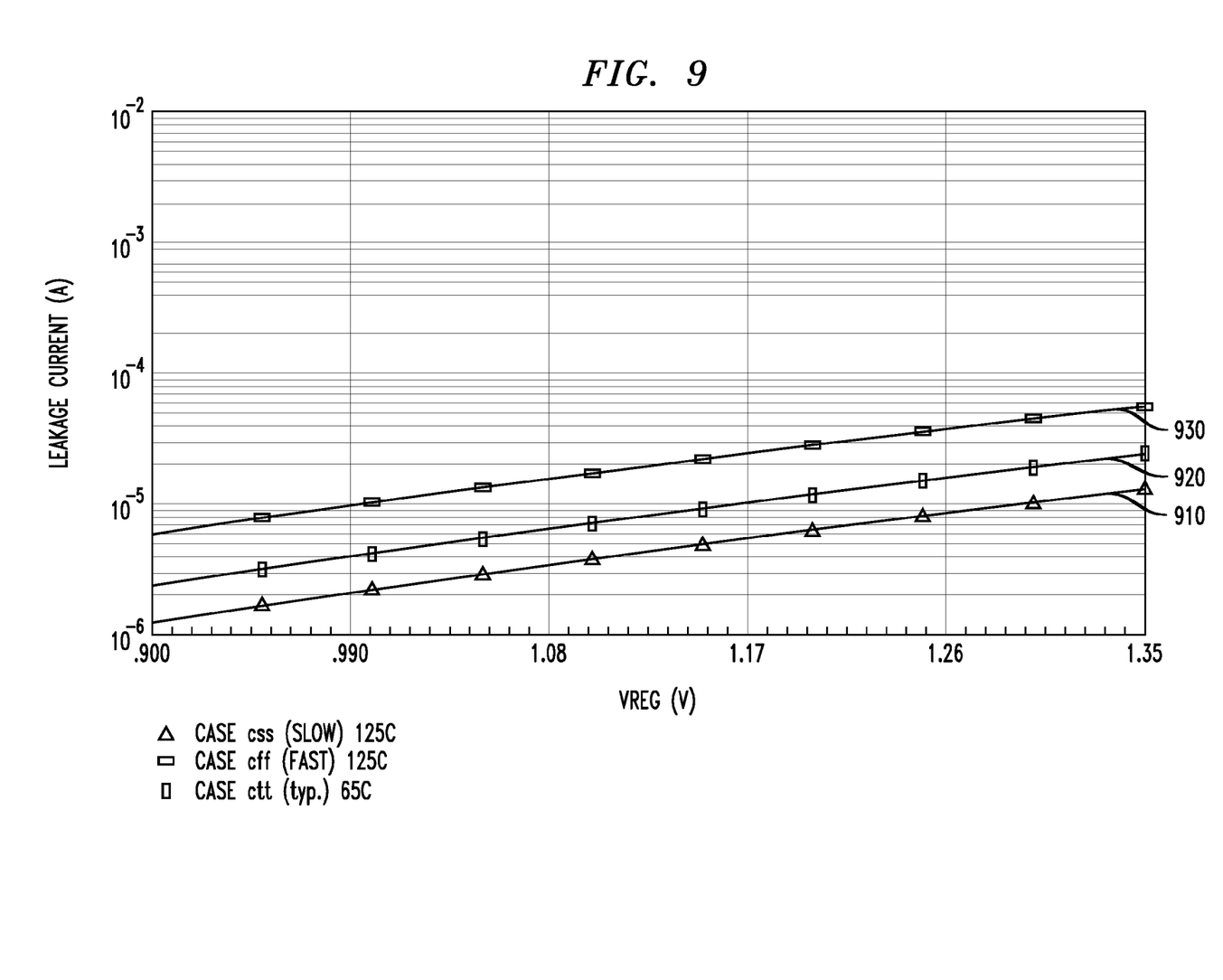
FIG. 9 illustrates a simulation of the variation in leakage current for a set of NMOS devices in an exemplary 65 nm LP technology as a function of the supply voltage (VREG) across its source and drain terminals.

FIG. 9 illustrates a simulation of the variation in leakage current for 480 instances of an NMOS device in 65 nm LP technology as a function of the voltage across its source and drain terminals (VREG). The leakage current is shown for "slow" 910, "typical" 920 and "fast" 930 CMOS processes. Under the "fast" silicon process case 930, the leakage current is about 50 uA at the maximum supply voltage of 1.32 V and is about four times the magnitude of the current under a "slow" silicon process 910 In addition, in all process cases, the leakage current is increased by about a factor of five between supply voltages of 1.08 V and 1.35 V If the disclosed calibration process is used to set the voltage across these devices, the leakage current under a "fast" silicon process 930 at a supply voltage of 1.08 V is 16 uA, A maximum post calibration leakage current of 23.8 uA occurs under the "typical" silicon process 920 at a supply voltage of 1.32 V and represents just less than 50% of the leakage current without a calibration process.

Impact of Calibration Process on Reliability

One criteria for assuring the reliability of an integrated circuit is to set the linewidths of metal traces wide enough to prevent the occurrence of electromigration. Insufficient linewidths will lead to an increase in metal trace resistance and potentially an open circuit. An electromigration audit is performed on a layout derived netlist that contains parasitic resistance and capacitive elements as part of the design process. The circuit designer must choose the appropriate silicon process condition that results in maximum power dissipation. For the CMOS buffer example described above in conjunction with FIGS. 5 and 6, the maximum supply current occurs under the "fast" silicon process at a supply voltage of 1.32 V Under the calibration process, however, the maximum power dissipation occurs under the "typical" process condition and represents a much smaller current than the value under a "fast" silicon process at 1.32 V. Hence, the resulting trace widths required to assure reliability can be much less. This has the further advantage of reducing the capacitance of traces in the circuit which is a major source of degradation in performance. Finally, it also results in much less design effort. Typically, circuit or layout changes to meet electromigration reliability requirements are done at the very end of the design process and ale timely.

Figure 10:
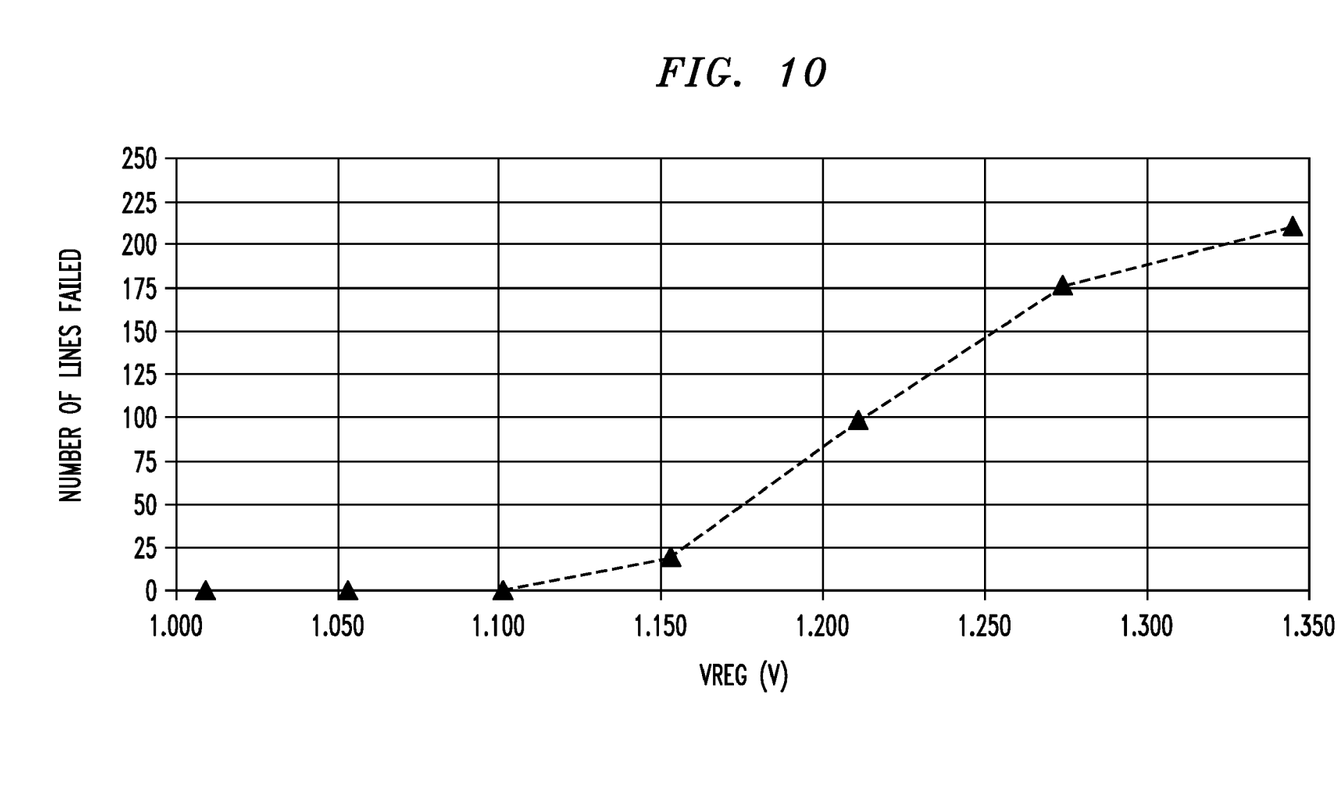
FIG. 10 indicates the number of layout features identified as electromigration failures as a function of supply voltage for a VCO used in a serializer/deserializer circuit in accordance with the present invention.

As an example of the sensitivity of an electromigration audit to supply voltage under the "fast" process condition FIG. 10 indicates the number of layout features identified as electromigration failures as a function of supply voltage for a VCO used in a serializer/deserializer circuit.

Since the calibration process sets the supply voltage for the "fast" process case to 1.08 V, and since no features were found to fail electromigration reliability limits under the "typical" process case at 1.32 V, no changes were required to the VCO layout as a result of the electromigration audit. If the calibration process were not used, as shown in FIG. 10, about 200 features must be modified to meet electromigration reliability requirements.

Impact of Calibration Process on Design Process

The use of the VCO frequency calibration process requites some positive changes to the design process. A few changes are discussed to the analog and digital design processes.

Analog Design Process

Prior to examining the performance of analog circuits whose supply voltage is governed by the calibration process, the specific supply voltages selected for each silicon process case under consideration is required.

As an example, if simulations of the circuit are to be performed using the "slow" silicon process, a supply voltage of 1.32 V is used. Without the use of the calibration process, circuit performance using a supply voltage of both 1.08 V and 1.32 V under the "slow" silicon process must be simulated. Since the use of a low supply voltage with a "slow" silicon process results in a very significant degradation in performance, the circuit need not be designed to meet its performance criteria under this particularly difficult combination of silicon process and supply voltage. This allows the circuit to be optimized for higher performance as neither larger buffers nor higher supply currents are required to meet this set of process and supply voltage conditions.

Digital Design Process

The impact to the digital design process revolves around a different set of silicon process and environmental cases for use in circuit design and validation. In the digital design process today, a set of nominal, fast and slow timing models are provided for design and validation purposes. Using the calibration process described above, the fast and slow process cases are replaced with, perhaps, a "cal_fast" and "cal_slow" case respectively. The "cal_fast" case is derived from characterizing logic cells under fast silicon process, but using a minimum supply voltage. The "cal_slow" case reflects characterization of cells under a slow silicon process condition with a maximum supply voltage. Hence, a circuit designer might utilize the nominal process case, the "cal_fast" and the "cal_slow" process cases to both design and verify the operation of a circuit. The use of the "fast" and "slow" timing models are not required as the device will never be set to operate under the conditions defined as "fast" and "slow." The use of "cal_fast" and "cal_slow" device models eases the design process significantly for those designs that are technology limited, or alternately, reduces power and area requirements for circuits that are not technology limited.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computers the machine becomes an apparatus for practicing the invention When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

I claim:

1. A method for calibrating a voltage controlled oscillator, wherein said voltage controlled oscillator comprises a power supply input, a control voltage input and at least one gate delay element, wherein said voltage controlled oscillator has a frequency that is a function of a delay of said gate delay element and a voltage applied to said power supply input, said method comprising:

varying an output voltage of a programmable voltage source through a range of values;

applying said output voltage to said power supply input of said voltage controlled oscillator;

comparing an output clock frequency of said voltage controlled oscillator to a reference clock frequency for each of said output voltage values; and selecting a value of said output voltage in a calibration mode that provides an approximate minimum frequency difference between said output clock frequency and said reference clock frequency.

2. The method of claim 1, further comprising the step of establishing a control voltage of said voltage controlled oscillator such that said voltage controlled oscillator operates at a constant frequency.

3. The method of claim 1, wherein said voltage controlled oscillator is an N-stage voltage controlled ring oscillator.

4. The method of claim 1, wherein said output clock frequency is a divided version of an output of said voltage controlled oscillator.

5. The method of claim 1, wherein said selected output voltage value is provided as a voltage to one or more additional circuits.

6. The method of claim 1, wherein said selected output voltage value is provided as a voltage setting for use by another voltage source to apply a voltage to one or more additional circuits.

7. The method of claim 1, wherein said selected output voltage value provides an overall average indicator of a silicon process.

8. The method of claim 7, wherein a lower value of said selected output voltage relative to a nominal voltage value is selected for a "fast" silicon process.

9. The method of claim 7, wherein a higher value of said selected output voltage relative to a nominal voltage value is selected for a "slow" silicon process.

10. The method of claim 1, further comprising the step of removing power from said voltage controlled oscillator following said selecting step.

11. An integrated circuit, comprising:
    a voltage controlled oscillator comprising a power supply input, a control voltage input and at least one gate delay element, wherein said voltage controlled oscillator has a frequency that is a function of a delay of said gate delay element and a voltage applied to said power supply input;
    a programmable voltage source generating an output voltage that is applied to said power supply input of said voltage controlled oscillator; and
    a frequency comparator for comparing an output clock frequency of said voltage controlled oscillator to a reference clock frequency for each of a plurality of values of said output voltage, wherein a value of said output voltage is configured in a calibration mode to be selected that provides an approximate minimum frequency difference between said output clock frequency and said reference clock frequency.

12. The integrated circuit of claim 11, wherein a control voltage of said voltage controlled oscillator is established such that said voltage controlled oscillator operates at a constant frequency.

13. The integrated circuit of claim 11, wherein said voltage controlled oscillator is an N-stage voltage controlled ring oscillator.

14. The integrated circuit of claim 11, further comprising a frequency divider to generate said output clock frequency as a divided version of an output of said voltage controlled oscillator.

15. The integrated circuit of claim 11, wherein said selected output voltage value is provided as a voltage to one or more additional circuits.

16. The integrated circuit of claim 11, wherein said selected output voltage value is provided as a voltage setting for use by another voltage source to apply a voltage to one or more additional circuits.

17. The integrated circuit of claim 11, wherein said selected output voltage value provides an overall average indicator of a silicon process.

18. The integrated circuit of claim 17, wherein a lower value of said selected output voltage relative to a nominal voltage value is selected for a "fast" silicon process.

19. The integrated circuit of claim 17, wherein a higher value of said selected output voltage relative to a nominal voltage value is selected for a "slow" silicon process.

20. A calibration system, comprising:
    a voltage controlled oscillator comprising a power supply input, a control voltage input and at least one gate delay element, wherein said voltage controlled oscillator has a frequency that is a function of a delay of said gate delay element and a voltage applied to said power supply input;
    a programmable voltage source generating an output voltage that is applied to said power supply input of said voltage controlled oscillator; and
    a frequency comparator for comparing an output clock frequency of said voltage controlled oscillator to a reference clock frequency for each of a plurality of values of said output voltage, wherein a value of said output voltage is configured in a calibration mode to be selected that provides an approximate minimum frequency difference between said output clock frequency and said reference clock frequency.

* * * * *